(12) United States Patent
Kokubo et al.

(10) Patent No.: US 6,652,653 B2
(45) Date of Patent: Nov. 25, 2003

(54) COATING APPARATUS, METHOD FOR PRODUCING COLOR FILTER SUBSTRATE BY USE OF THE COATING APPARATUS, AND LIQUID-CRYSTAL DISPLAY APPARATUS USING THE COLOR FILTER SUBSTRATE PRODUCED BY THE METHOD

(75) Inventors: Satoshi Kokubo, Kawasaki (JP); Nobuyuki Ishikawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/436,988

(22) Filed: Nov. 9, 1999

(65) Prior Publication Data

US 2003/0127048 A1 Jul. 10, 2003

(30) Foreign Application Priority Data

Nov. 10, 1998 (JP) ............................. 10-318522

(51) Int. Cl.[7] ................................. B05C 3/02
(52) U.S. Cl. ................. 118/410; 118/DIG. 2
(58) Field of Search ................. 118/410, 419, 118/411, 415, DIG. 2; 427/356

(56) References Cited

U.S. PATENT DOCUMENTS

| | | |
|---|---|---|
| 2,761,791 A | 9/1956 | Russell |
| 4,230,793 A | 10/1980 | Losert et al. ............... 430/315 |
| 4,696,885 A | 9/1987 | Vijan ......................... 430/311 |
| 5,336,322 A * | 8/1994 | Tobisawa et al. |
| 5,435,847 A * | 7/1995 | Shibata et al. |
| 5,545,256 A * | 8/1996 | Fukuda et al. |
| 5,547,510 A * | 8/1996 | Aizawa et al. |
| 5,591,266 A * | 1/1997 | Osawa et al. |
| 5,643,363 A * | 7/1997 | Hosogaya et al. |

FOREIGN PATENT DOCUMENTS

| | | | |
|---|---|---|---|
| JP | 2-207865 | * | 8/1991 |
| JP | 5-11105 | | 1/1993 |
| JP | 5-142407 | | 6/1993 |
| JP | 6-339656 | | 12/1994 |

* cited by examiner

Primary Examiner—Brenda A. Lamb
(74) Attorney, Agent, or Firm—Fitzpatrick, Cella, Harper & Scinto

(57) ABSTRACT

A coating apparatus has a paint supply device, a mouthpiece for dispensing a paint supplied from the paint supply device, and a stage for holding a coated object. A 10-point average roughness $R_z$ of a surface of the mouthpiece facing the coated object is not more than 1.0 μm.

4 Claims, 7 Drawing Sheets

(UNIT : mm)

COATING APPARATUS, METHOD FOR PRODUCING COLOR FILTER SUBSTRATE BY USE OF THE COATING APPARATUS, AND LIQUID-CRYSTAL DISPLAY APPARATUS USING THE COLOR FILTER SUBSTRATE PRODUCED BY THE METHOD

BACKGROUND OF THE INVENTION

1. Field of the Invention

The present invention relates to a coating apparatus for coating a surface of objects to be coated, which are supplied one by one, with a liquid paint by a die coater, for example, in coating a resist in the semiconductor fabrication field, coating an ultraviolet absorbing layer in the optical filter fabrication field, and so on. The present invention also relates to a method for producing a color filter substrate using the coating apparatus and a liquid crystal display apparatus using the color filter substrate produced by the method.

2. Related Background Art

There has been a strong need to develop technology which thinly and uniformly coats small substrates having a length of less than 1 m in the coating direction, such as plastic substrates for optical filters, glass substrates for liquid crystal displays, glass substrates for color filters, and so on, with a variety of paints. For industrially forming a coating film on such substrates, a single substrate coating method is employed; the objects to be coated (coated objects) are supplied one by one to a coater to be coated with a paint and then conveyed to the next step such as drying or the like.

Spin coaters, bar coaters, and roller coaters are commonly used for forming the coating film on the coated objects.

Among them, a method using the spin coater is a method widely used in the coating of photoresist on semiconductor wafers, in which the coating film can be formed by dropping the paint onto the center of the surface of the rotating object to be coated. Thicknesses of coating films obtained by this method can be made uniform considerably accurately throughout the entire region of the coated object by selecting the paint from those kinds suitable for this method. The method, however, requires an extremely large amount of paint in order to yield a coating film of the desired thickness and thus is not economical. In addition, the paint sometimes attaches to the edge and the back surface of the coated object, and the paint scattered into the apparatus can gel or harden therein so as to degrade stability and cleanliness of the steps, thus causing degradation of the quality of coated products.

A method using the roller coater is a method for transferring the paint onto the coated object via a roller, which can be applied to the coating of long coated objects and to the coating of coated objects rolled in a roll form. However, since the paint is fed from a pan via the application roller onto the coated object in this method, the paint is exposed to air for a long period, so that the paint is apt to absorb moisture and deteriorate because of oxidization. In addition, the mixing of foreign matter into the paint occurs easily. This will result in degrading the quality of the coated products.

A method using the bar coater is a method for coating the coated object with the paint using a bar in which a thin wire is wound around a rod. This method has the disadvantage in that stripes often appear in the coating film, because the wire around the rod contacts the coated object.

Taking such disadvantages into consideration, use of the die coater has been proposed recently. Proposals of application of the die coater to the production of color filters are present in Japanese Patent Applications Laid-Open No. 5-11105, No. 5-142407, and No. 6-339656.

The die coaters have been popular heretofore in the coating of thick films and continuous coating of high viscosity paints, and coating methods known for forming the coating film on the coated object by the die coater include a curtain flow method, an extrusion method, a bead method, and so on, as described in U.S. Pat. Nos. 4,230,793, 4,696,885, and 2,761,791. Among them, the above bead method forms the coating film in such a manner that the paint is delivered through a slit provided in a mouthpiece of the die coater to form a paint mass called a coating bead between the mouthpiece and the coated object moving relative to the mouthpiece while maintaining a constant clearance thereto and that the paint is drawn out in this state with movement of the coated object to form the coating film. By adopting the bead method for continuously forming the coating film while supplying the same amount of paint through the slit as an amount of consumption for the formation of the coating film, the uniformity of thickness can be accomplished with considerably high accuracy in the coating film thus formed. Since there is little waste of the paint and since a paint feed path is hermetically closed before delivery through the slit, this method can prevent the deterioration of the paint and the mixing of foreign matter and can maintain the high quality of resultant coating film.

However, in cases wherein the die coater is employed for coating a color layer in the production of color filters for liquid crystal displays, nonuniformity of thickness directly affects the quality in the form of nonuniformity of colors and also affects the gap of the liquid crystal layer in the coating of overcoat layers. There is thus the demand for the coating of thin films with high thickness uniformity.

One of the causes of thickness nonuniformity of the coating film formed by the die coater is variation in the volume of the coating bead in the coating width direction because of physical properties at the interface between the tip of a paint supply device, i.e., a front lip face and a rear lip face, and the paint and at the interface between the surface of the coated object and the paint, cohesion of the paint itself, and so on.

For solving this problem, it is possible to control the variation in the volume of the coating bead in the coating width direction by increasing the surface energy of the paint or by setting the width of the front lip and the width of the rear lip ($t_2$ and $t_3$ in FIG. 1) at the tip of the mouthpiece to optimum widths.

In the coating by the die coater, however, the paint has a rise near a start of coating and near an end of coating, but the paint flows back to the central part of the coated object because of the self-leveling action of the paint before being dried, and the paint-back regions are formed as thicker coating areas than an average film thickness of the coating film. When the surface energy of the paint is decreased, this self-leveling action of the paint tends to become stronger, so that the thicker portions of the paint film are expanded, so as to narrow the effective region of the coated object, thus degrading the quality of coated products and increasing the production cost.

When consideration is given to the cohesion, the surface energy, etc. of the paint in order to form the paint bead in a straight line shape, it is better to narrow the width of the front lip and the width of the rear lip. However, when the front lip width and the rear lip width are narrowed, the bead becomes easier to break because of shear force caused by relative speed between the mouthpiece and the coated object. There is thus a limit to the increase in relative speed between the mouthpiece and the coated object and a permissible range also becomes smaller for the clearance between the mouthpiece and the coated object. Therefore, there are problems concerning the increase of time necessary for the coating and the decrease of yield.

SUMMARY OF THE INVENTION

An object of the present invention is to solve the above problems and to provide a coating apparatus that can form a coating film in a uniform thickness with a wide effective area on a coated object in a short time and in a good yield, in the coating by the die coater, a method for producing a color filter using the coating apparatus, and a liquid crystal display apparatus using the color filter produced by this method.

The inventors have conducted extensive and intensive research in order to solve the above problems and focused attention on the surface roughness of the front lip face and rear lip face facing the coated object at the tip of the mouthpiece of a paint dispensing device. Then the inventors came to conclude that the smaller the surface roughness, the higher the uniformity of thickness distribution in the coating width direction of the coating film and that decrease of the surface roughness was effective to controlling the thickness variation of the whole coating film to small levels.

The decrease of surface roughness lowers the surface energy of the front lip face and rear lip face, so as to increase interfacial force between the paint and the front lip face/the rear lip face and thus increase adhesion. As a result, the paint bead is formed in such a straight line shape as to accurately follow the shape of the front lip face and the rear lip face.

Specifically, a coating apparatus of the present invention is a coating apparatus comprising a paint supply device, a mouthpiece for dispensing a paint supplied from the paint supply device, and a stage for holding a coated object, wherein a 10-point average roughness $R_z$ of a surface of the mouthpiece facing the coated object; is not more than 1.0 $\mu$m.

A method for producing a color filter according to the present invention comprises a step of coating a substrate with a photosensitive resin composition by the above coating apparatus, a step of forming a pattern in the photosensitive composition to form a black matrix pattern, and a step of dispensing color ink onto a space of the black matrix pattern.

Further, a liquid crystal display apparatus of the present invention comprises a color filter substrate produced by the above production method, an opposed substrate opposed to the color filter substrate, and a liquid crystal composition sealed in between the color filter substrate and the opposed substrate.

In many cases, stainless steel such as SUS316 or the like pursuant to JIS G4304 is usually selected as a material for the mouthpiece of the die coater in terms of rigidity, workability, corrosion resistance, solvent resistance, cost efficiency, and so on. It is, however, normally difficult to polish the stainless steel to a very low level of surface roughness. Particularly, polishing below $R_z$=0.4 $\mu$m is hard. The surface roughness of the front lip face and rear lip face as contact portions of the mouthpiece with the liquid is also subject to this constraint. For example, if the material is titanium, the polishing thereof will be easier down to a much smaller surface roughness. However, it is not practical in an economical sense to make the whole mouthpiece of a titanium material. The inventors found that the coating was able to be made in a uniform thickness distribution of the coating film when at least the front lip face and rear lip face as the liquid contact portions of the mouthpiece were made of the material with higher polishability than the material of the mouthpiece body. Specifically, it can be implemented by depositing the material different from the mouthpiece body on the front lip face and rear lip face of the mouthpiece by sputtering or the like or by preparing separate members of such material and joining them to the front and rear lip faces.

DETAILED DESCRIPTION OF THE PREFERRED EMBODIMENTS

Figure 1:
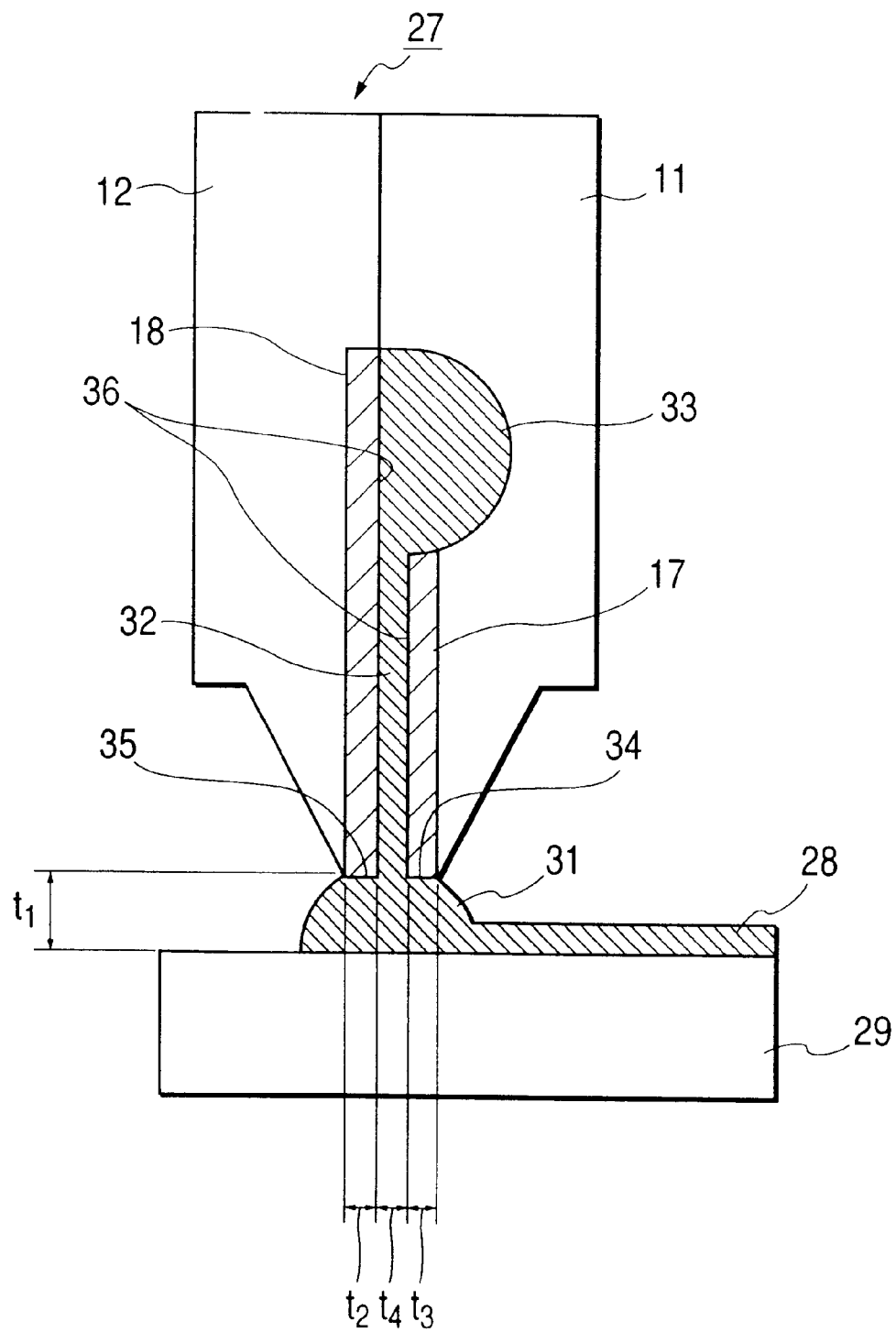
FIG. 1 is a sectional view showing a preferred example of the mouthpiece used in the coating apparatus of the present invention.

As illustrated in FIG. 1, the mouthpiece 27 comprised of front lip 11 and rear lip 12 is provided with a paint supply port (not illustrated) and a manifold 33 for uniformizing pressure distribution of the paint during a period of flow of the paint from the paint supply port to a slit 32. The paint is supplied from paint tank 21 to the mouthpiece 27 by fixed displacement pump 26. This fixed displacement pump 26 is a positive displacement pump such as a gear pump, a diaphragm pump, a syringe pump, or the like. Another paint supply means other than the pumps can be one of a type in which the paint tank 21 is enclosed in a pressure vessel and in which pressure-increased air is supplied from a press pump to the pressure vessel to push the paint out of the paint tank. A filter 25 and a switching valve 23 are provided in a path of pipe 22 from the paint tank 21 to the fixed displacement pump 26 as the occasion may demand.

Figure 2:
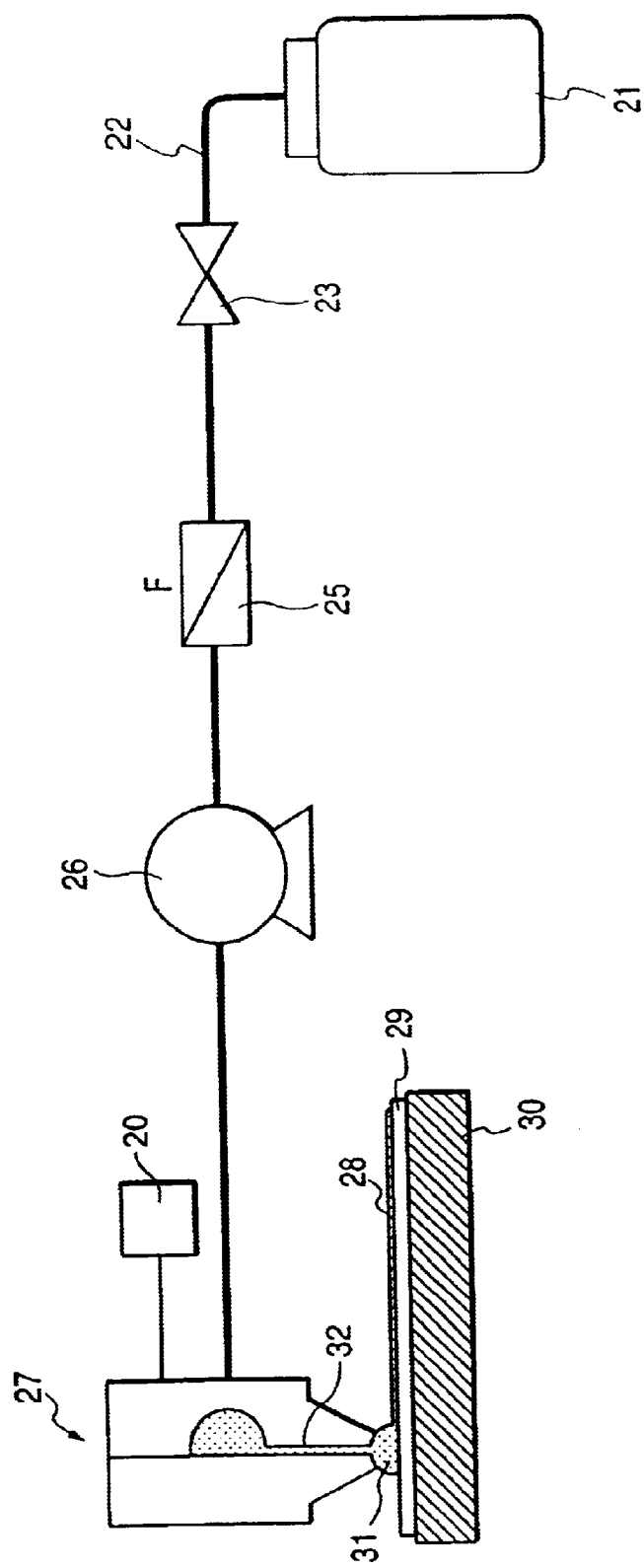
FIG. 2 is a schematic diagram showing an example of the coating apparatus of the present invention.

The paint supply device according to the present invention means the system from the paint tank 21 to the fixed displacement pump 26 in FIG. 2.

In the mouthpiece 27, the manifold 33 is formed by boring a hole in the front lip 11 or in the rear lip 12, or in the both, and the manifold 33 is provided with the paint supply port. The front lip 11 and rear lip 12 are opposed to each other to be joined through a fixed clearance (slit gap $t_4$), thereby forming the slit 32. This slit gap $t_4$ is preferably 10 to 200 $\mu$m. If the gap $t_4$ is too wide, the liquid pressure of the paint will tend to become nonuniform in the coating width direction. If the slit gap $t_4$ is too small, loss of output pressure will tend to become large.

Preferred materials for the front lip 11 and rear lip 12 are stainless steels such as SUS316, SUS303, SUS304, etc., pursuant to JIS G4304, which are excellent in workability, chemical resistance, and long term stability.

When the widths of front lip face 34 and rear lip face 35 as tip faces of the mouthpiece 27 are defined as front lip width $t_3$ and rear lip width $t_2$, respectively, in the coating direction, each of the widths $t_2$, $t_3$ is made preferably in the range of 0.02 to 2.0 mm. If the widths $t_2$ and $t_3$ are too wide, a cross-section of paint bead 31 will tend to become non-uniform in the coating width direction. If they are too narrow, it will become easier for the paint to flow to side faces of the front lip 11 and rear lip 12, so as to facilitate the occurrence of coating failure.

The 10-point average roughness $R_z$ of the surfaces of the mouthpiece 27 facing the coated object 29, which are the front lip face 34 and rear lip face 35 (hereinafter referred to as lip faces), is not more than 1.0 μm. If the roughness $R_z$ of the surfaces is greater than 1.0 μm, the thickness distribution of the coating film will become nonuniform in the coating width direction. The 10-point average roughness $R_z$ of the lip faces is preferably 0.06 to 1.0 μm and more preferably 0.06 to 0.5 μm. If the 10-point average roughness $R_z$ is very small, working will be difficult and the time and cost will be great.

Front lip plate 17 and rear lip plate 18 are bonded to a surface of the front lip body 11 and to a surface of the rear lip body 12, respectively, on the slit 32 side. Preferred materials for the front lip plate 17 and rear lip plate 18 are superhard materials, for example, such as titanium, tantalum, aluminum nitride, and so on. These materials are excellent in surface polishability and permit the working for decreasing the surface roughness $R_z$. The "surface polishability" stated herein does not mean ease in polishing, but means a property of capability of being polished down to a low surface roughness.

Figure 3:
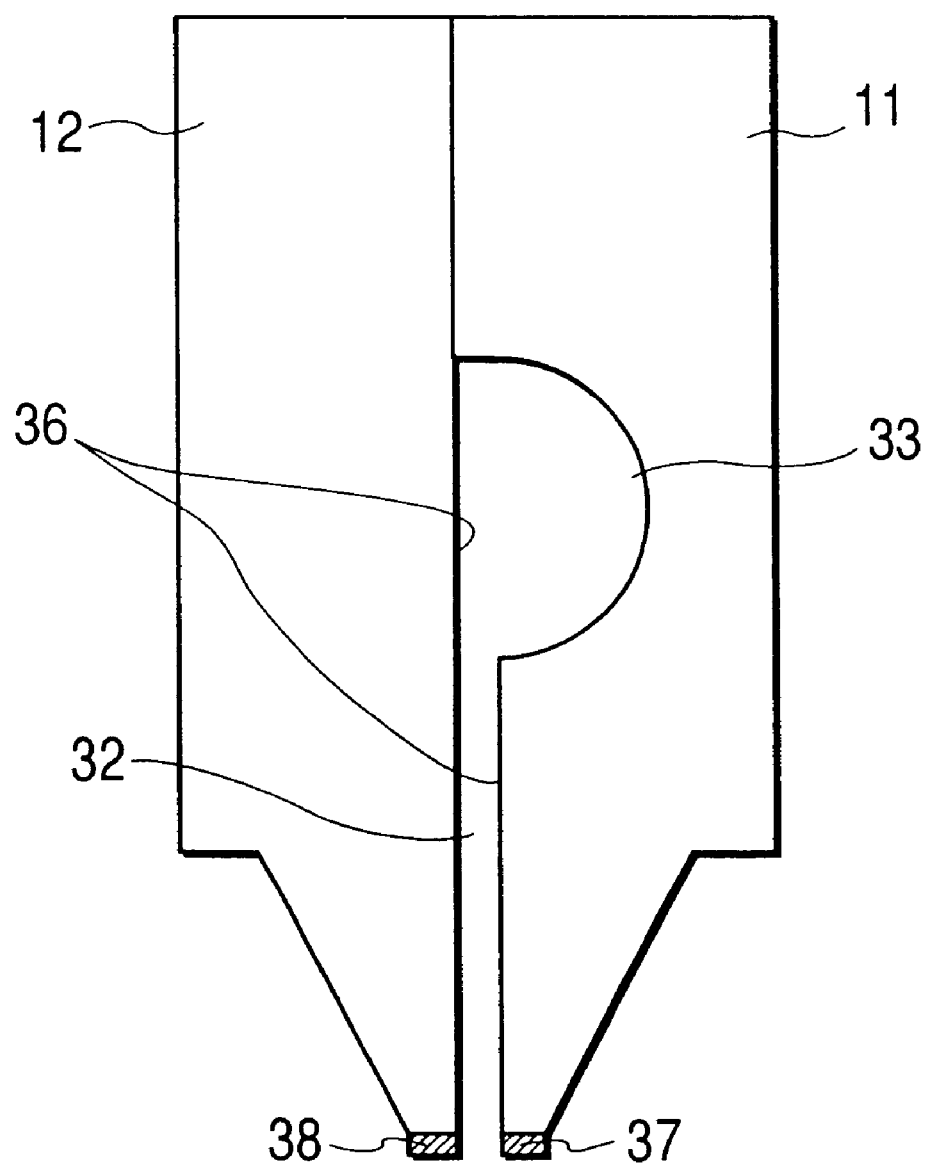
FIG. 3 is a sectional view showing the structure of another example of the mouthpiece used in the coating apparatus of the present invention.
Figure 4A:
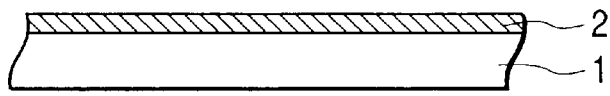
FIGS. 4A, 4B, 4C, 4D and 4E are step diagrams showing an example of the method for producing the color filter substrate according to the present invention.
Figure 4B:
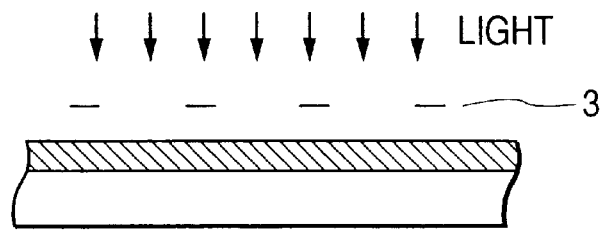
Figure 4C:
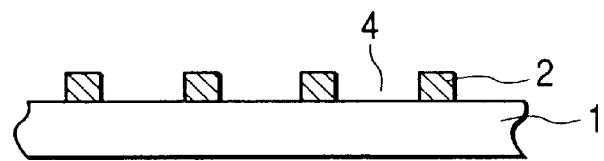
Figure 4D:
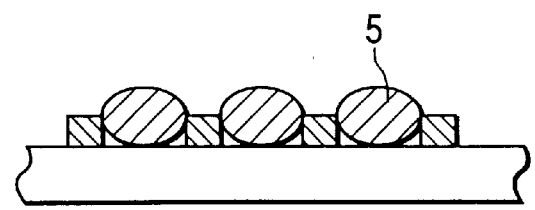
Figure 4E:
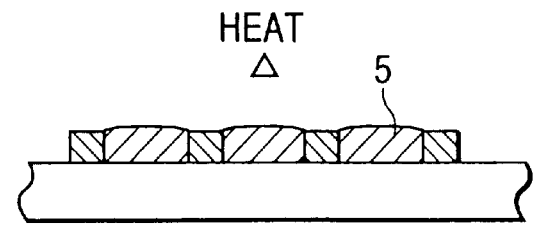

In the structure of the mouthpiece 27 illustrated in FIG. 1, paint guide surfaces 36 of slit surfaces are made of a material different from the front lip body 11 and the rear lip body 12, but only the front lip face 34 and rear lip face 35 may be constructed of front lip plate 37 and rear lip plate 38, for example, as illustrated in FIG. 3. Since the materials such as titanium, tantalum, and the like themselves are expensive materials and necessitate high working cost, the uniform coating film can be obtained without increasing the price of the coating apparatus more than necessary, by making the portions requiring low surface roughness, i.e., the front lip face and rear lip face of such material.

Means for making the front lip face 34 and rear lip face 35 of the material different from the bodies thereof may be deposition of a material selected from titanium nitride, tantalum nitride, aluminum nitride, diamondlike carbon film, diamond thin film, and so on, by sputtering or the like. These materials are also excellent in the polishability and permit control of the surface roughness $R_z$ to not more than 1.0 μm.

By bonding the plates of separate members to the main bodies or by depositing the different material onto the maim bodies or by polishing the front lip face 34 and rear lip face 35 as the occasion may demand, as described above, the surface roughness $R_z$ is made not more than 1.0 μm and preferably in the range of 0.06 to 1.0 μm. The surface roughness $R_z$ in the present invention is that defined in Japanese Industrial Standard JIS B0601-1982, which is the 10-point average roughness in the reference length of 2.5 mm. The surface roughness is measured, for example, using "SURFCOM 575A," available from Tokyo Seimitsu or "Perthometer C5D" available from Perthen Inc., or the like.

In the step of coating the coated object with the paint by use of the single substrate coating apparatus of the present invention, the mouthpiece 27 is placed opposite to the coated object 29 through the fixed gap (clearance $t_1$), as illustrated in FIG. 1. This clearance $t_1$ is preferably 25 to 500 μm. If this clearance $t_1$ is too wide, it will become difficult to form the paint bead 31. If the clearance $t_1$ is too narrow, the front lip face 34 or the rear lip face 35 can contact the coated object 29 because of partial unevenness of the coated object. This could result in forming uncoated portions or forming the coating film 28 extremely thick.

The coated object 29 is mounted on a flat carrier stage 30 and is under vacuum suction so as to prevent a shift during coating.

The supply of paint starts from the fixed displacement pump 26 to the mouthpiece 27 and, immediately after it or after a lapse of a fixed time, the mouthpiece 27 or the carrier stage 30 is moved in parallel by moving means 20. When the mouthpiece is about to reach the edge of the coated object, the supply of the paint from the fixed displacement pump 26 is stopped, and the movement of the mouthpiece 27 or the carrier stage 30 is also stopped. A thin film is formed in a uniform thickness distribution in this way.

The coating method using the coating apparatus of the present invention is suitably applicable to the process for forming the color filter as a component of a liquid crystal device for color display. Normally, the color filter is produced by forming a shield layer of black metal or black resin called a black matrix or black stripes, a color layer having color pixels in opening portions of the shield layer, the color pixels being of the three primary colors of R (red), G (green), and B (blue), and a protective layer provided as the occasion may demand, on a transparent substrate. When the coating apparatus of the present invention is applied to the coating of the shield layer, color layer, and protective layer or to the coating of resists used in the patterning of coating films, the coating films can be formed with a wide effective area and in uniform thickness, whereby good color filters can be formed in high yield.

The color filter can be produced, for example, by a sequence of steps as illustrated in FIGS. 4A to 4E. FIGS. 4A to 4E correspond to the following steps (a) to (e).

(a) The transparent substrate 1 is coated with a black, photosensitive resin composition 2 by the coating apparatus of the present invention. The thickness of the coating film is enough to achieve the required shield property, which is, for example, about 1 μm. The transparent substrate is often made, for example, of glass, but it may also be a plastic film or a plastic sheet. In order to enhance the adhesion of the transparent substrate to the black matrix and to the color ink, a thin film capable of enhancing the adhesion may also be preliminarily formed on the transparent substrate as the occasion may demand.

(b) The coating layer is pre-cured, for example, using a hot plate or the like, and is then exposed using an exposure apparatus having a wavelength to which the photosensitive resin composition is sensitive and using a mask 3 having a predetermined pattern.

(c) Development is then carried out. In the case of the negative type, portions shielded by the mask 3 during the exposure will be dissolved into a developer to expose the surface of the substrate and the exposed portions will remain as a black matrix pattern. Subsequent to it, the substrate is rinsed in order to wash the developer away and then is dried lightly by spin drying, air knife, or the like. After this, the substrate surfaces in spaces 4 of the black matrix become clean.

(d) Ink 5 of a predetermined color is dispensed onto the spaces 4 of the black matrix. An ink dispensing method can be selected from ordinary printing methods or the like such as offset printing, gravure printing, screen printing, and so on, but, particularly, an ink-jet printing method using an ink jet printer is preferably applicable, because it does not have to use a plate during printing and thus permits high accuracy patterning only by control of the diameter of ink droplets. The ink used herein is one properly selected from ink materials which are apt to be repelled on the above black matrix pattern but easy to wet the pixel portions in the spaces of the black matrix. The surface energy (surface tension) is normally 30 to 70 dyne/cm. Such ink may be either of the dye type or of the pigment type, and a solvent thereof may contain a hydrophilic, organic solvent or the like in a water matrix.

It is preferable to use thermosetting ink as the ink, because curing of the ink and final curing of the black matrix can be carried out in a common step.

A thermosetting component in the ink is preferably a material that can be cured under a temperature condition approximately equal to that for the final curing of the black matrix, and it can be selected from acrylic resin., epoxy resin, phenol resin, enthiol, and so on. It can also be selected from materials obtained by adding aromatic amine, acid anhydride, or the like to the above resins according to the process temperature required.

(e) A heating-drying operation (post-bake) is carried out for the final curing of the black matrix, thereby forming the black matrix. It is preferable to also effect the final curing of the ink at the same time.

After that, the protective film is provided by the coating apparatus of the present invention as the occasion may demand.

Figure 5:
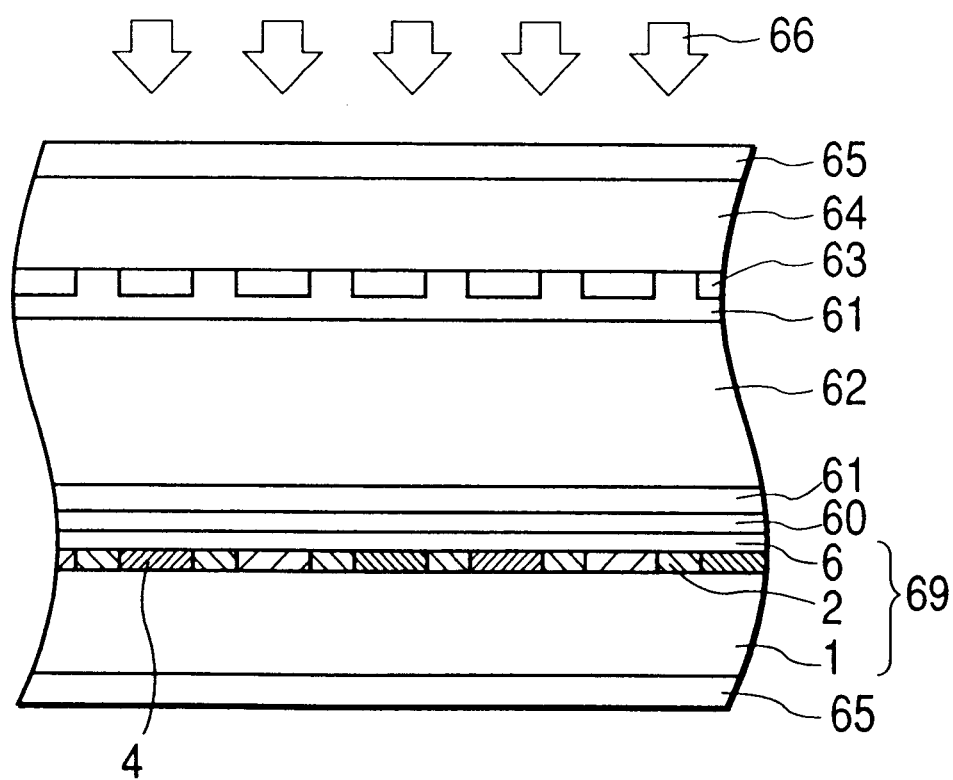
FIG. 5 is a sectional view showing an example of the liquid crystal display apparatus of the present invention.

FIG. 5 slows a cross-section of a TFT color liquid crystal panel incorporating the color filter produced by the coating apparatus of the present invention. It should be noted here that the form of the panel is not limited to the present embodiment.

The color liquid crystal panel is produced normally by aligning the color filter substrate 1 with an opposed substrate 64 and sealing a liquid crystal composition fit in between them. TFTs (not illustrated) and transparent pixel electrodes 63 are formed in a matrix on the internal surface of one substrate 64 of the liquid crystal panel. On the internal surface of the other substrate 1, the color filter substrate 69 is laid so that the color materials of R, G, and B are arranged at the positions opposite to the pixel electrodes, and a transparent, opposed electrode (common electrode) 60 is formed over the entire surface of the color filter 69. The black matrix is formed normally on the color filter substrate side. Further, alignment films 61 are provided on the inside surfaces of the both substrates, and liquid crystal molecules can be aligned in a certain direction by rubbing of the alignment films. A polarizing sheet 65 is bonded to the outside surface of each glass substrate, and a liquid crystal compound 62 is filled in the space (about 2 to 5 $\mu$m) between these glass substrates. It is common practice to use a combination of a scattering plate (not illustrated) with a fluorescent lamp (not illustrated) as a back light. The liquid crystal compound works as an optical shutter for varying the transmittance of light from the back light, thereby effecting display. Numeral 6 denotes a protective layer which is formed optionally.

EXAMPLE 1

The paint used herein was the photosensitive resin composition of the acrylic type in the following composition, and coating was carried out using the coating apparatus provided with the paint dispensing unit having the mouthpiece in the structure of FIG. 1.

| photosensitive resin composition | |
|---|---|
| terpolymer of the following composition: | 10.0 parts by weight |
| methyl methacrylate | 5.0 parts by weight |
| hydroxymethyl methacrylate | 3.0 parts by weight |
| N-methylolacrylamide | 2.0 parts by weight |
| triphenylsulfonium triflate ("TPS-105" available from Midori Kagaku) | 0.3 part by weight |
| ethyl cellosolve | 89.7 parts by weight |

The coated object was a non-alkaline glass substrate (Corning "1737") with dimensions of 360 mm×465 mm×0.7 mm, and the paint consisting of the above photosensitive resin composition was applied thereonto, while setting the slit gap $t_4$ to 50 $\mu$m and the clearance $t_1$ to 75 $\mu$m. The fixed displacement pump used was the diaphragm pump and a high precision servo motor was employed for driving the carrier stage. The above paint was preliminarily charged into the paint tank before the paint was filled inside the feed path up to the mouthpiece. The widths of the front lip face and rear lip face of the mouthpiece both were 0.5 mm. The lateral width of the outlet port at the tip of the slit was 355 mm in order to prevent the coating film from being formed in margins 2.5 mm wide at both edges of the glass substrate.

The front lip and rear lip were made of SUS303, and the front lip plate and rear lip plate as illustrated in FIG. 1 were made of the titanium material and joined to the surfaces of the slit. The surfaces of the front lip plate and rear lip plate were polished to a surface roughness $R_z$=0.06 $\mu$m.

The coating was carried out under such conditions that the substrate conveying speed was 12 mm/s, the dispensing rate was 32.8 $\mu$l/s, and the coating start point and end point were 1.0 mm inside from the edge of the substrate. The coated substrate obtained was baked at 90° for twenty minutes by the hot plate, thereby obtaining the coating film.

Figure 6:
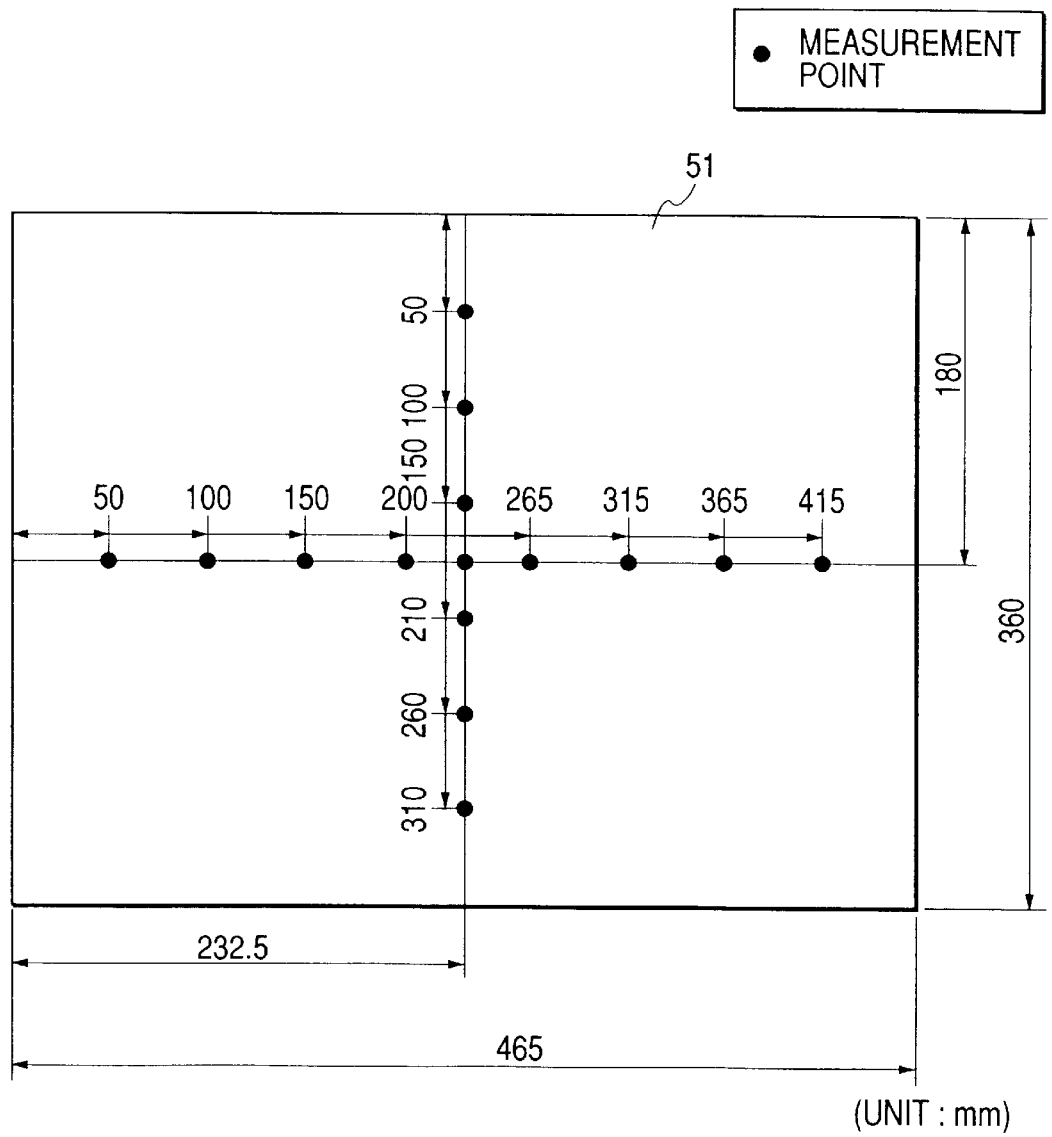
FIG. 6 is a plan view showing measurement points of thickness in the coating film formed by the coating apparatus of the present invention.

Evaluation of the thickness distribution was conducted for the coating film obtained. The evaluation was carried out as follows. The film surface was partly peeled off at fifteen points on the coated substrate 51 illustrated in FIG. 6, and level differences were measured with a contact-type film thickness meter "FP-20" available from KLA-Tencor Corp. to obtain coating thicknesses at the respective points. The maximum and minimum were chosen out of the coating thicknesses at the fifteen points, and absolute values were computed of differences between the maximum/minimum and an average value of the coating thicknesses at the fifteen points. Then the greater of the absolute values was evaluated in percentage, and the result was expressed by ±%.

The coating film of the present example had an average thickness of 1.12 $\mu$m and a variation of ±3.8% against the average thickness.

EXAMPLE 2

The coating film was formed in the same manner as in Example 1 except that the structure of the mouthpiece was the one illustrated in FIG. 3, and the coating film obtained was evaluated as in Example 1. The mouthpiece was used after the front lip face and rear lip face of the main bodies were polished to $R_z$=1.6 μm, and after the plates of the titanium material were joined thereonto and polished to a surface roughness $R_z$=0.08 μm.

The coating film obtained had an average thickness of 1.12 μm and a variation of ±3.9% against the average thickness.

EXAMPLE 3

The surfaces other than the front lip face and rear lip face of the front lip and rear lip were covered by Kapton tape, and titanium nitride was deposited in a thickness of 0.01 mm on only the front lip face and rear lip face. This was polished to a surface roughness $R_z$=0.1 μm.

The coating film was obtained and evaluated in the same manner as in Example 1 except for the use of the mouthpiece in the above structure. The coating film obtained had an average thickness of 1.13 μm and a variation of ±4.1% against the average thickness.

EXAMPLE 4

The substrate was coated with a color coat-forming paint for color filter ("CR-7001" available from Fuji Film Olin Co.), using the mouthpiece used in Example 1. This paint is a photosensitive resin composition having a viscosity of 12 cP and a solid content of 24.9 wt %. The coated substrate and coated area were the same as in Example 1, and the coating conditions were as follows: the substrate carrying speed=30 mm/s and the dispensing rate=26.8 ml/s. After the coating, the paint was baked at 90° C. for five minutes by the hot plate. The coating film obtained had an average thickness of 1.30 μm and a variation of ±3.2% against the average thickness.

EXAMPLE 5

Using the glass substrate used in Example 1, the three-layer chromium black matrix was patterned, and with the paint used in Example 4, coating, baking, exposure, and development were carried out repeatedly thereon for each of the three colors of R, G, and B to obtain a color filter. The coating conditions were the same as in Example 4.

A liquid crystal color display was constructed using the color filter obtained and it was able to display high definition images.

Comparative Example 1

The mouthpiece was constructed by making the front lip and rear lip of SUS303. The surface roughness $R_z$ of the front lip face and rear lip face of this mouthpiece was 1.6 μm, and the rear lip width and front lip width both were 0.5 mm. The coating was carried out in the same manner as in Example 1 except for the use of this mouthpiece, thereby obtaining the coating film.

The coating film obtained had an average thickness of 1.14 μm and a variation of ±5.5% against the average thickness.

Comparative Example 2

Using the mouthpiece used in Comparative Example 1, the substrate was coated with the color coat-forming paint for color filter in the same manner as in Example 4. The coating film obtained had an average thickness of 1.32 μm and a variation of ±5.1% against the average thickness.

The results of the above examples and comparative examples are listed together in Table 1 below.

TABLE 1

| | Front lip face & rear lip face | Surface roughness $R_z$ (μm) | Paint | Average thickness (μm) | Variation of thickness (±%) |
|---|---|---|---|---|---|
| Ex. 1 | plates (Ti) | 0.06 | photo-sensitive resin composition | 1.12 | 3.8 |
| Ex. 2 | plates (Ti) | 0.08 | photo-sensitive resin composition | 1.12 | 3.9 |
| Ex. 3 | TiN films | 1.0 | photo-sensitive resin composition | 1.13 | 4.1 |
| Ex. 4 | plates (Ti) | 0.06 | CR-7001 | 1.30 | 3.2 |
| Comp. Ex. 1 | SUS303 | 1.6 | photo-sensitive resin composition | 1.14 | 5.5 |
| Comp. Ex. 2 | SUS303 | 1.6 | CR-7001 | 1.32 | 5.1 |

EXAMPLE 6

Figure 7:
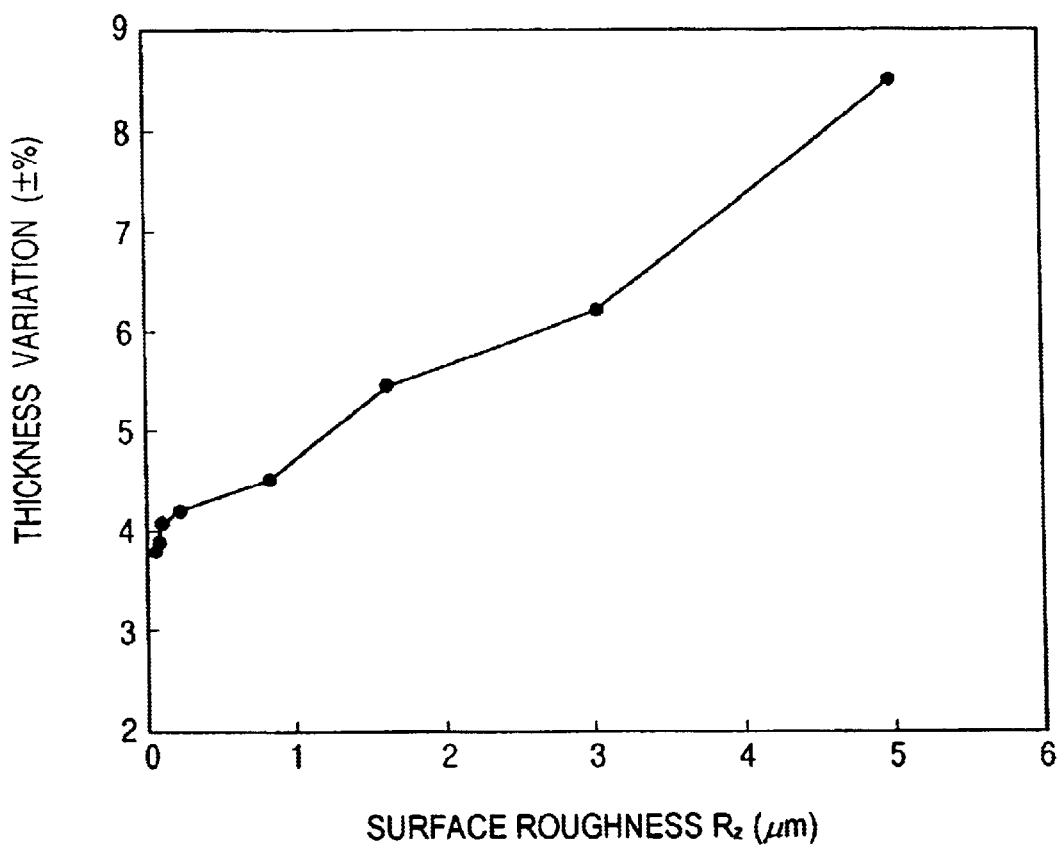
FIG. 7 is a diagram showing the relation between surface roughness $R_z$ and thickness variation of the coating film in Example 6 of the present invention.

Further prepared were mouthpieces having the surface roughness $R_z$ of the front lip face and rear lip face in the range of 1.6 μm to 5.0 μm in the same structure as in Comparative Example 1 and mouthpieces having the surface roughness $R_z$ in the range of less than 1.6 μm in the same structure as in Example 1. The coating was carried out with those mouthpieces in the same manner as in Example 1 and the relation was investigated between the surface roughness $R_z$ and the variation of thickness of the coating films obtained. The results are illustrated in FIG. 7.

As described above, the present invention enables a uniform paint bead to be formed throughout the entire region of the coating width by limitation of the surface roughness of the front lip face and rear lip face and also enables the surface energy of the front lip face and rear lip face to be increased by the improvement in the surface roughness, whereby the shape of the paint bead can be retained stably during the coating and whereby the coating film can be obtained in uniform thickness as a result.

By making the front lip face and rear lip face of a material different from the main bodies, degrees of freedom of working are increased, and the uniform coating film can be obtained without great increase of device cost. In the case wherein the members including the front lip face and rear lip face are joined as separate members to the main bodies, when the members are damaged, only the members need be replaced; therefore, this structure is economical. In the case wherein the thin film of the material different from the main bodies is deposited on the front lip face and on the rear lip face, the pressure distribution of the paint in the slit can be uniformized throughout the entire region of the coating width and the coating film can be formed in uniform thickness in the coating width direction. Further, a material suitable for working can be selected without considerable decrease of cost efficiency.

Further, when the color filter is produced using the coating apparatus of the present invention, the waste of paint is decreased in the production process, and the color filters with good quality can be provided in a high yield by forming the thin films at high speed and with high accuracy. This can enhance the color display characteristics and decrease the cost in the liquid crystal displays using the color filters.

What is claimed is:

1. A coating apparatus comprising:
   a paint supply device;
   a paint dispensing device consisting of a mouthpiece provided with a slit through which a paint supplied from said paint supply device is first dispensed as a coating bead formed between said mouthpiece and a transparent substrate prepared as an object to be coated;

a stage for holding said object to be coated at a constant distance from said paint dispensing device; and means for moving at least one of said paint supply device and said stage relative to the other of said paint supply device and said stage, wherein paint is drawn out of said slit to form a coating film on said object to be coated upon the relative movement of at least one of said paint supply device and said stage, and wherein said mouthpiece is comprised of a rear lip and a front lip such that a surface of said rear lip and a surface of said front lip parallel to a surface of said object to be coated have a 10-point average roughness $R_z$ not more than 1.0 μm.

2. The coating apparatus according to claim 1, wherein said 10-point average roughness $R_z$ is 0.06–1.0 μm.

3. The coating apparatus according to claim 2, wherein said 10-point average roughness $R_z$ is 0.06–0.5 μm.

4. The coating apparatus according to claim 1, wherein said mouthpiece further comprises a mouthpiece body and a lip plate having a surface of said rear lip and a surface of said front lip formed from a material different from said mouthpiece body.

* * * * *

UNITED STATES PATENT AND TRADEMARK OFFICE
CERTIFICATE OF CORRECTION

PATENT NO.    : 6,652,653 B2
DATED         : November 25, 2003
INVENTOR(S)   : Kokubo et al.

It is certified that error appears in the above-identified patent and that said Letters Patent is hereby corrected as shown below:

<u>Title page,</u>
Item (*) Notice: please insert as following:
--      This patent issued on a continued prosecution application filed under 37 CFR 1.53(d), and is subject to the twenty year patent term provisions of 35 U.S.C. 154(a)(2). --
Item [56], Reference Cited, FOREIGN PATENT DOCUMENTS,
        "JP 2-207865 *    8/1991" should read -- JP 2-207865  *    8/1990 --

<u>Column 3,</u>
Line 41, "object;" should read -- object --.

<u>Column 5,</u>
Line 59, "maim" should read -- main --.

<u>Column 7,</u>
Line 38, "slows" should read -- shows --.
Line 45, "fit" should be deleted.
Line 56, "the both substrates," should read -- both substrates, --.

Signed and Sealed this

First Day of June, 2004

JON W. DUDAS
*Acting Director of the United States Patent and Trademark Office*